(12) United States Patent
Kawasumi

(10) Patent No.: US 9,142,273 B2
(45) Date of Patent: Sep. 22, 2015

(54) SEMICONDUCTOR MEMORY DEVICE

(71) Applicant: Atsushi Kawasumi, Kawasaki (JP)

(72) Inventor: Atsushi Kawasumi, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 550 days.

(21) Appl. No.: 13/623,329

(22) Filed: Sep. 20, 2012

(65) Prior Publication Data

US 2013/0250659 A1    Sep. 26, 2013

(30) Foreign Application Priority Data

Mar. 21, 2012   (JP) ................................ 2012-064455

(51) Int. Cl.
*G11C 7/22* (2006.01)
*G11C 11/419* (2006.01)
*G11C 11/412* (2006.01)

(52) U.S. Cl.
CPC .............. *G11C 7/227* (2013.01); *G11C 11/419* (2013.01); *G11C 11/412* (2013.01)

(58) Field of Classification Search
CPC ..... G11C 7/227; G11C 11/412; G11C 11/419
See application file for complete search history.

(56) References Cited

U.S. PATENT DOCUMENTS 6,717,842 B2 * 4/2004 Watanabe et al. ............. 365/154
7,688,634 B2 * 3/2010 Richter et al. ............. 365/185.2
8,111,571 B2 2/2012 Kawasumi
8,144,532 B2 * 3/2012 Kawasumi .................... 365/194
8,279,693 B2 * 10/2012 Wang ............................ 365/205
8,400,821 B2 * 3/2013 Tachibana ..................... 365/156

FOREIGN PATENT DOCUMENTS

JP    2010-157279    7/2010

OTHER PUBLICATIONS

Bharadwaj S. Amrutur, et al., "A Replica Technique for Wordline and Sense Control in Low-Power SRAM's", IEEE Journal of Solid-State Circuits, vol. 33, No. 8, Aug. 1998, pp. 1208-1219.
Umut Arslan, et al., "Variation-Tolerant SRAM Sense-Amplifier Timing Using Configurable Replica Bitlines", IEEE 2008 Custom Intergrated Circuits Conference (CICC), 2008, pp. 415-418.

* cited by examiner

*Primary Examiner* — Harry W Byrne
*Assistant Examiner* — Lance Reidlinger
(74) *Attorney, Agent, or Firm* — Oblon, McClelland, Maier & Neustadt, L.L.P.

(57) ABSTRACT

According to one embodiment, a semiconductor memory device includes a memory cell array including memory cells, word lines connected to the memory cell array to select rows of the memory cell array, first bit lines connected to the memory cell array to select columns of the memory cell array, a replica cell array including replica cells respectively connected to the word lines, and storing information on characteristics of the rows of the memory cell array, and a second bit line connected to the replica cells. An operation is changed for each row of the memory cell array based on the information in the replica cells.

17 Claims, 7 Drawing Sheets

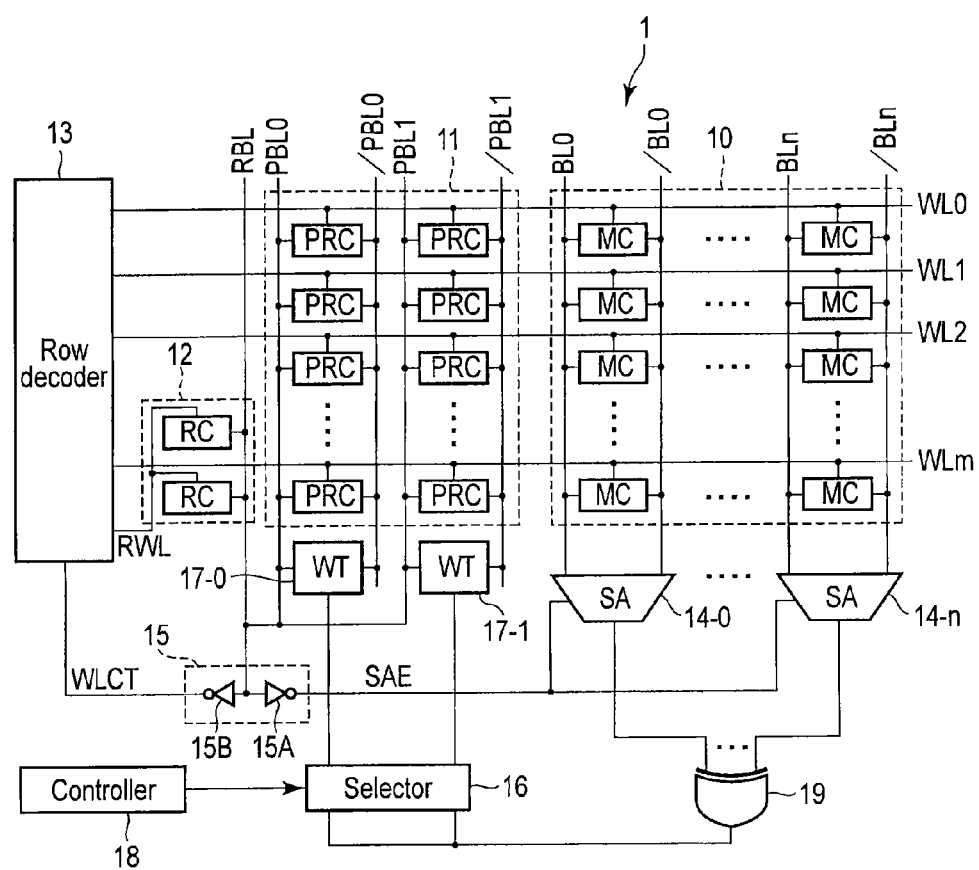
F I G. 1

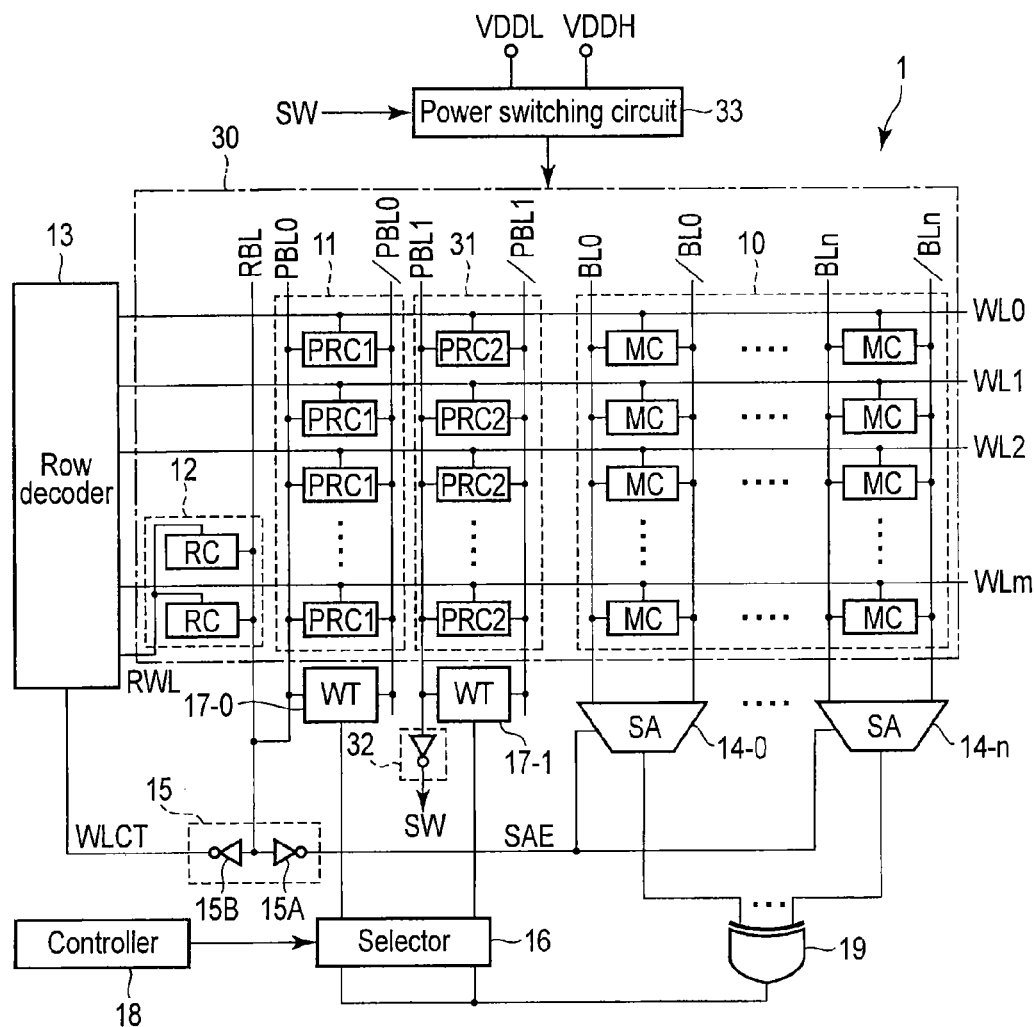
F I G. 8

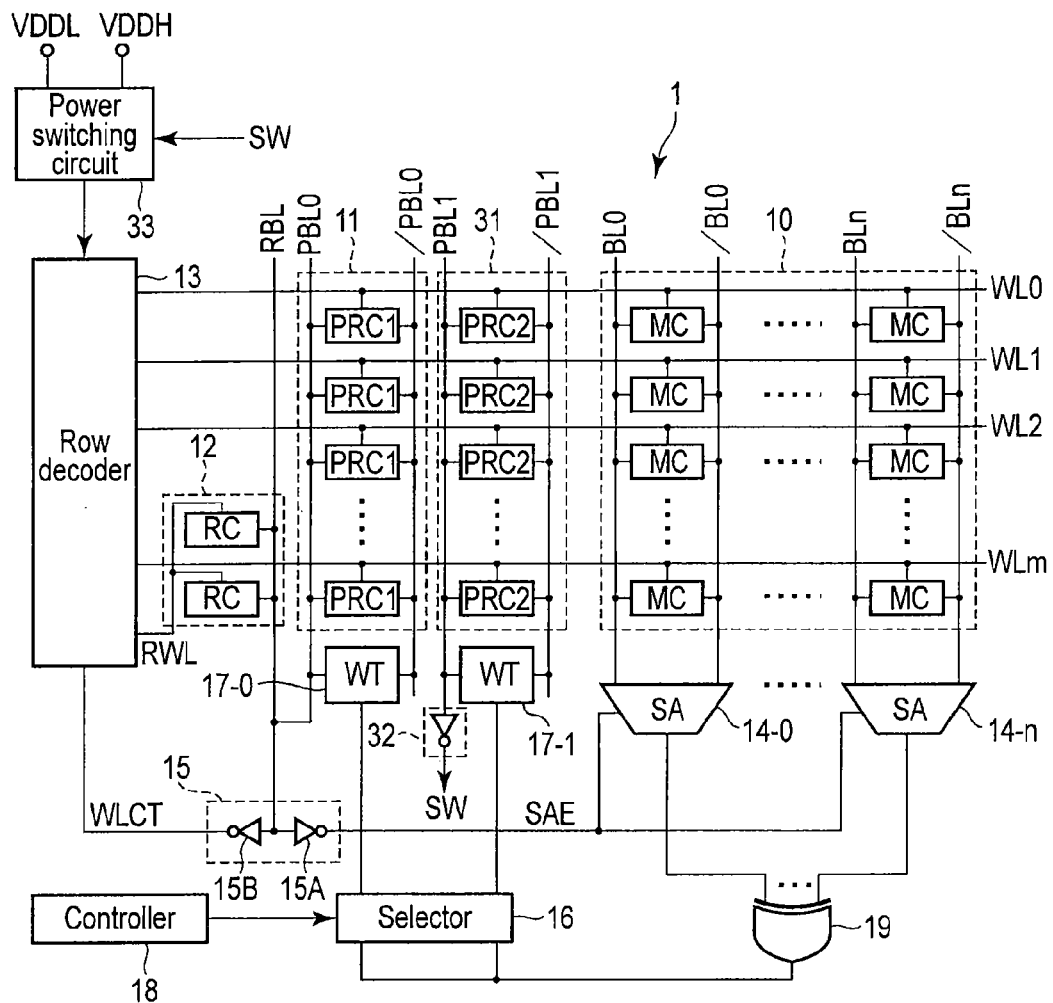
F I G. 9

US 9,142,273 B2

SEMICONDUCTOR MEMORY DEVICE

CROSS-REFERENCE TO RELATED APPLICATIONS

This application is based upon and claims the benefit of priority from Japanese Patent Application No. 2012-064455, filed Mar. 21, 2012, the entire contents of which are incorporated herein by reference.

FIELD

Embodiments described herein relate generally to a semiconductor memory device.

BACKGROUND

A static random access memory (SRAM) is known as a kind of semiconductor memory devices. To increase the operating speed of the SRAM, it is possible to reduce a bit line delay. The bit line delay is the time from the opening of a word line to the appearance of a signal having a desired amplitude on a bit line. The magnitude of the amplitude is determined by the offset voltage of a sense amplifier for amplifying the signal on the bit line. A signal amplitude exceeding the offset voltage of the sense amplifier is unnecessary for sensing, and increases the power consumption.

Decreasing the power supply voltage is generally an effective means for implementing a low-power-consumption operation, but it is not always possible to sufficiently achieve the effectiveness for the SRAM. This is so because the power of the SRAM is mainly consumed by the charge/discharge of bit lines, and the power consumption by the charge/discharge of bit lines is proportional to the bit line amplitude that is determined by the offset voltage of the sense amplifier and almost independent of the power supply voltage. Therefore, while the power consumption reduces in proportion to the second power of the power supply voltage in a normal logic circuit, the power consumption can be reduced in proportion to only the first power of the power supply voltage in the SRAM.

In addition, when the SRAM is operated at a low voltage, the variation in cell current increases. Accordingly, if sense amplifier activation and word line deactivation are performed in accordance with a cell having the lowest operating speed in a memory cell array, a signal larger than an amplitude necessary for sensing appears on a bit line for a cell other than the slowest cell, and the power is consumed more than necessary.

BRIEF DESCRIPTION OF THE DRAWINGS

FIG. 1 is a block diagram of a semiconductor memory device according to the first embodiment;
FIG. 8 is a block diagram showing the arrangement of a semiconductor memory device according to the third embodiment;
and
FIG. 9 is a block diagram showing the arrangement of a semiconductor memory device according to the fourth embodiment.

DETAILED DESCRIPTION

Figure 2:
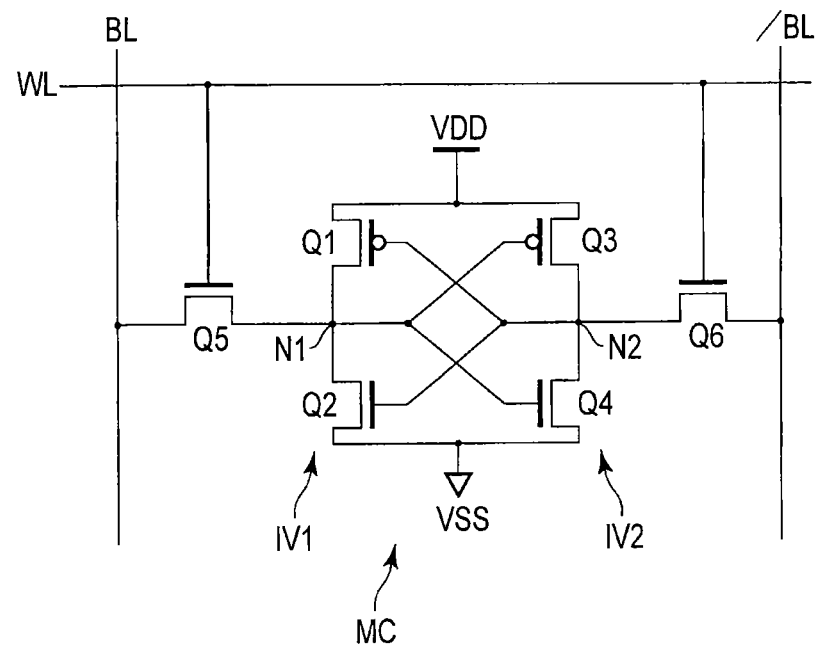
FIG. 2 is a circuit diagram of a memory cell.

In general, according to one embodiment, there is provided a semiconductor memory device comprising:
a memory cell array including memory cells;
word lines connected to the memory cell array to select rows of the memory cell array;
first bit lines connected to the memory cell array to select columns of the memory cell array;
a replica cell array including replica cells respectively connected to the word lines, and storing information on characteristics of the rows of the memory cell array; and
a second bit line connected to the replica cells,
wherein an operation is changed for each row of the memory cell array based on the information in the replica cells.

The embodiments will be described hereinafter with reference to the accompanying drawings. In the description which follows, the same or functionally equivalent elements are denoted by the same reference numerals, to thereby simplify the description.

First Embodiment

[1] Arrangement of Semiconductor Memory Device

A semiconductor memory device of this embodiment is an SRAM. FIG. 1 is a block diagram of a semiconductor memory device 1 according to the first embodiment. The semiconductor memory device 1 includes a memory cell array 10, programmable replica cell array 11, and replica cell array 12.

The memory cell array 10 includes a plurality of memory cells MC arranged in a matrix. The memory cell array 10 also includes (m+1) word lines WL0 to WLm, and (n+1) pairs of bit lines BL0 and /BL0 to BLn and /BLn, where m and n are integers greater than zero. The memory cells MC are arranged at the intersections of the word lines WL and pairs of bit lines BL and /BL.

The programmable replica cell array 11 includes a plurality of programmable replica cells PRC arranged in a matrix. The programmable replica cell array 11 also includes the same word lines WL0 to WLm as those of the memory cell array 10. In addition, the programmable replica cell array 11 includes one or a plurality of pairs of bit lines PBL and /PBL. Although FIG. 1 shows two pairs of bit lines PBL0 and /PBL0 and PBL1 and /PBL1, it is possible to set an arbitrary number of pairs of bit lines PBL and /PBL, that is to say, an arbitrary number of columns in the programmable replica cell array 11. The programmable replica cells PRC are arranged at the intersections of the word lines WL and pairs of bit lines PBL and /PBL. The circuit configuration of the programmable replica cell PRC is the same as that of the memory cell MC.

The replica cell array 12 includes one or a plurality of replica cells RC. Although FIG. 1 shows two replica cells RC, it is possible to set an arbitrary number of replica cells RC. The two replica cells RC are connected together to a replica bit line RBL and replica word line RWL. The replica bit line RBL is connected to all the bit lines PBL in the programmable replica cell array 11.

A row decoder 13 is connected to the word lines WL and replica word line RWL. The row decoder 13 selects a row of the memory cell array 10. Also, the row decoder 13 selects the replica word line RWL at the same timing as the selection timing of one word line WL.

Sense amplifiers (SAs) 14-0 to 14-n are respectively connected to the pairs of bit lines BL0 and /BL0 to BLn and /BLn. Each sense amplifier 14 senses and amplifies a voltage (signal) appearing on the pair of bit lines BL and /BL.

A timing generator 15 is connected to the replica bit line RBL. The timing generator 15 generates an enable signal SAE for controlling the activation timing of the sense amplifier SA, and a timing signal WLCT for controlling the deactivation timing of the word line WL, based on the voltage of the replica bit line RBL. For example, the timing generator 15 includes two inverters 15A and 15B. The inputs of inverters 15A and 15B are connected to the replica bit line RBL. Inverter 15A outputs the enable signal SAE to the enable terminal of each sense amplifier SA. Inverter 15B outputs the timing signal WLCT to the row decoder 13.

The output of each sense amplifier 14 is connected to the input of an exclusive OR (XOR) gate 19. The output of the XOR gate 19 is connected to write circuits (WTs) 17-0 and 17-1 via a selector 16.

The selector 16 supplies the output from the XOR 19 to one of write circuits 17-0 and 17-1 based on the control of a control circuit 18. The write circuit 17 writes the data supplied from the selector 16 to the programmable replica cell PRC through the pair of bit lines PBL and /PBL.

FIG. 2 is a circuit diagram of the memory cell MC. The memory cell MC is, for example, a six-transistor memory cell. The memory cell MC includes inverters IV1 and IV2 whose inputs and outputs are mutually connected. Inverter IV1 includes a PMOS transistor Q1 and NMOS transistor Q2 connected in series between a power line at a power supply voltage VDD and a ground line at ground voltage VSS. Inverter 1V2 includes a PMOS transistor Q3 and NMOS transistor Q4 connected in series between the power line and ground line.

The gates of PMOS transistor Q1 and NMOS transistor Q2 are connected to a connection node N2 between PMOS transistor Q3 and NMOS transistor Q4. The gates of PMOS transistor Q3 and NMOS transistor Q4 are connected to a connection node N1 between PMOS transistor Q1 and NMOS transistor Q2. Connection node N1 is connected to the bit line BL via an NMOS transistor (transfer transistor) Q5. Connection node N2 is connected to bit line /BL via an NMOS transistor (transfer transistor) Q6. The gates of NMOS transistors Q5 and Q6 are connected to the word line WL. A write operation using the six-transistor memory cell is performed on both the pair of bit lines BL and /BL. A read operation is performed by differential read of sensing a voltage difference between the pair of bit lines BL and /BL. However, the read operation may also be single-end read that is performed from only one of the pair of bit lines BL and /BL.

Note that in the following explanation, the signal levels of the power supply voltage VDD and ground voltage VSS will sometimes be expressed as high and low, respectively.

Figure 3:
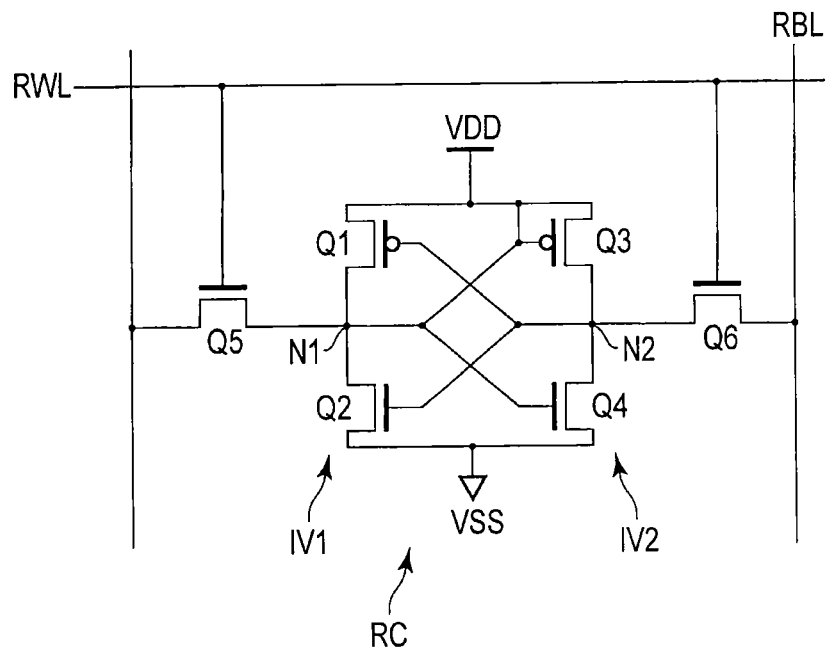
FIG. 3 is a circuit diagram of a replica cell.

FIG. 3 is a circuit diagram of the replica cell RC. The replica cell RC is designed to make the replica bit line RBL low when the replica word line RWL is asserted. Like the memory cell MC, the replica cell RC includes transistors Q1 to Q6. The gates of NMOS transistors Q5 and Q6 are connected to the word line WL. A connection node N2 is connected to the replica bit line RBL via NMOS transistor Q6. A connection node N1 is connected to a power line at the power supply voltage VDD. This connection relationship fixes stored data in the replica cell RC.

[2] Operation of Semiconductor Memory Device 1

The operation of the semiconductor memory device 1 arranged as described above will be explained below.

When the replica word line RWL is asserted, the replica cell RC makes the replica bit line RBL low. Since the replica cell RC has the same arrangement as that of the memory cell MC, the replica cell RC has the same characteristics as those of the memory cell MC for, for example, the process variation, temperature variation, and power supply voltage variation. Therefore, following the process variation, temperature variation, power supply voltage variation, and the like, the replica cell RC can change the timing at which the replica bit line RBL is made low, that is to say, the activation timing of the sense amplifier 14.

Furthermore, in this embodiment, the activation timing of the sense amplifier 14 is changed for each row of the memory cell array 10. The programmable replica cell PRC is prepared for this control. The programmable replica cell PRC stores information corresponding to the operation characteristic (operating speed) of a row of the memory cell array 10. When a word line is asserted in a read, the programmable replica cell PRC superposes its own stored data on the replica bit line RBL through the bit line PBL.

Figure 4:
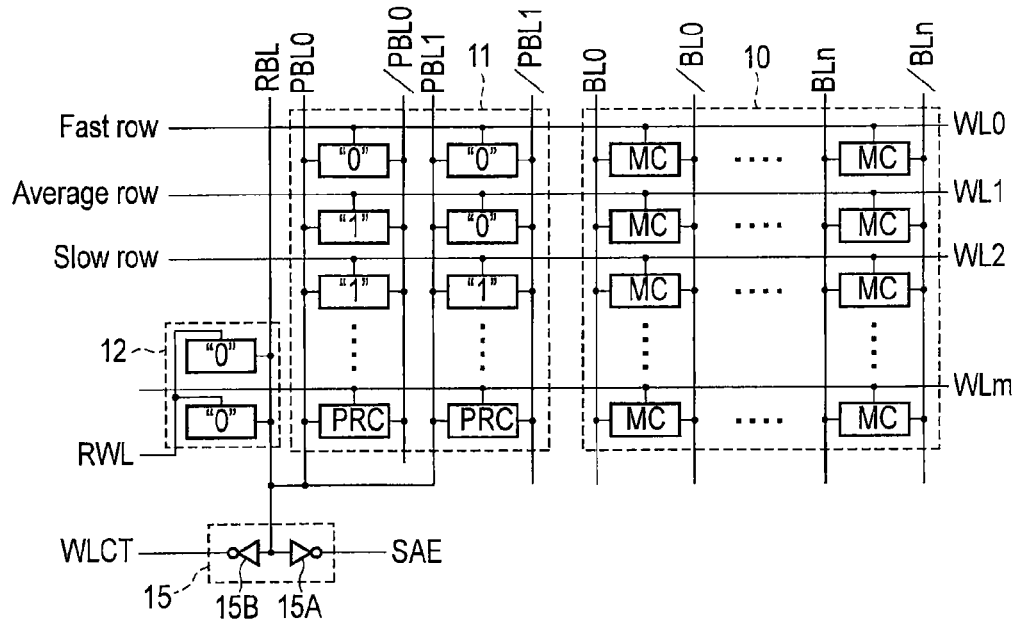
FIG. 4 is a view for explaining data of a programmable replica cell.

FIG. 4 is a view for explaining data in the programmable replica cell PRC. According to the results of an operation test, a memory cell group connected to word line WL0 form a row having a high operating speed, a memory cell group connected to word line WL2 form a row having a low operating speed, and a memory cell group connected to word line WL1 form a row having an average operating speed (an operating speed intermediate between those of the rows having high and low operating speeds). When a row is described as "having a high operating speed," it means that all the memory cells MC included in the row have operating speeds higher than a given threshold value. When a row is described as "having a low operating speed," it means that the operating speed of at least one memory cell MC included in the row is lower than the given threshold value. This is so because data is read at once from each row, so the operating speed of the row is determined by the slowest memory cell.

Binary 0 is stored in two programmable replica cells PRC connected to word line WL0 corresponding to the row having a high operating speed. When the word line WL is asserted (made high), the programmable replica cell PRC storing binary 0 transfers a low to the bit line PBL. That is, when word line WL0 is asserted, a low is transferred to bit lines PBL0 and PBL1. This advances the timing at which the replica bit line RBL connected to bit lines PBL0 and PBL1 goes low.

Binary 1 is stored in two programmable replica cells PRC connected to word line WL2 corresponding to the row having a low operating speed. When the word line WL is asserted, the programmable replica cell PRC storing binary 1 transfers a high to the bit line PBL. That is, when word line WL2 is asserted, a high is transferred to bit lines PBL0 and PBL1. This delays the timing at which the replica bit line RBL connected to bit lines PBL0 and PBL1 goes low.

Binary 1 and binary 0 are stored in two programmable replica cells PRC connected to word line WL1 corresponding to the row having an average operating speed. When word line WL1 is asserted, a high is transferred to bit line PBL0, and a low is transferred to bit line PBL1. Consequently, the voltages of bit lines PBL0 and PBL1 cancel out each other, and the voltage of the replica bit line RBL changes at almost the same timing as that when the replica bit line RBL goes low because of the replica cell RC alone.

In a read, the row decoder 13 activates (makes high) a selected word line WL. Subsequently, the programmable replica cell PRC connected to the selected word line WL superposes data on the replica bit line RBL. Consequently, the enable signal SAE goes high at an optimum timing, and sense amplifiers 14-0 to 14-$n$ having received the enable signal SAE respectively sense and amplify data on the pairs of bit lines BL0 and /BL0 to BLn and /BLn.

In addition, the timing signal WLCT goes high at the same timing as that of the enable signal SAE. The row decoder 13 having received the timing signal WLCT negates the selected word line WL (makes low).

Referring to FIG. 1, three kinds of information can be set for each row because two programmable replica cells PRC are connected to one word line WL. In this embodiment, the two programmable replica cells PRC connected to one word line WL have the same size. When the driving force is set to, for example, the power of 2, however, four kinds of timings can be achieved in the above-mentioned example. The number of columns in the programmable replica cell array 11 can be set to an arbitrary number. When the number of columns in the programmable replica cell array 11 is increased, an information amount settable for each row increases, so finer timing control is possible.

Next, an operation of writing to the programmable replica cell array 11 will be explained. First, binary 0 is written to all the programmable replica cells PRC. This is equivalent to maximally advancing the timings of all the rows in the memory cell array 10. Subsequently, an operation test of the memory cell array 10 is performed in this set state, and binary 1 is written to one programmable replica cell PRC of a row including a failed bit. This delays the activation timing of the sense amplifier 14 when reading data from the row. This operation test is conducted a number of times equal to the number of columns in the programmable replica cell array 11.

More specifically, after binary 1 is written to all the memory cells MC of the memory cell array 10 shown in FIG. 1, a given word line WL is asserted, and data is read from a corresponding row. In this state, the XOR gate 19 exclusively ORs the outputs from sense amplifiers 14-0 to 14-$n$. The write circuit 17 selected by the selector 16 writes the output data from the XOR gate 19 to the corresponding programmable replica cell PRC through the pair of bit lines PBL and /PBL. Data can be written to the programmable replica cell array 11 by repeating this operation.

Figure 5:
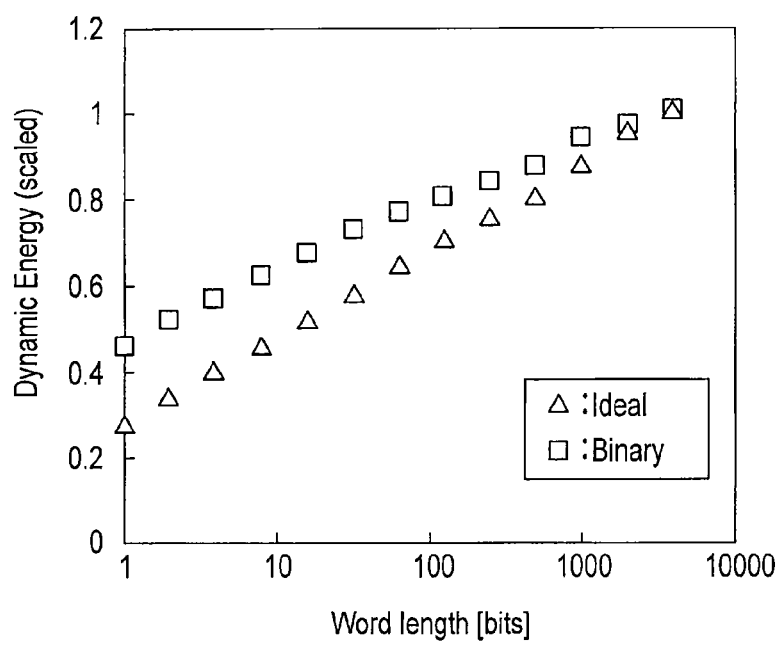
FIG. 5 is a graph showing the simulation results of energy consumption.

FIG. 5 is a graph showing the simulation results of energy consumption. In FIG. 5, the abscissa represents word length (bits) corresponding to the number of memory cells connected to one word line, and the ordinate represents normalized (scaled) dynamic energy to be consumed by a bit line. FIG. 5 shows an extent to which the dynamic energy can be reduced when the sense amplifier is activated by changing the timing for each row. Dynamic energy=1 is equivalent to performing no timing control for each row.

The triangles in FIG. 5 represent a graph (Ideal) when a timing can ideally be generated for each row, that is to say, when timings are steplessly generated. The squares in FIG. 5 represent a graph (binary) when timings are generated by two steps.

As can be understood from FIG. 5, the energy reducing effect increases as the word length decreases. This is so because when the word length is small, the probability at which an extremely slow cell is contained in the word length decreases. Also, the effect is higher when timings are steplessly generated than when binary timings are generated, but even the binary timings have an effect to some extent.

[3] Effects

In the first embodiment as described in detail above, the programmable replica cells PRC are formed for each row of the memory cell array 10, in addition to the replica cells RC for controlling the activation timings of the sense amplifiers 14. Information on the operating speed of each row of the memory cell array 10 is stored in the programmable replica cell PRC. In a read, data of the programmable replica cell PRC is superposed on the replica bit line RBL to which the replica cell RC is connected. The sense amplifier 14 is activated, that is to say, performs a sensing operation, based on the voltage of the replica bit line.

In the first embodiment, therefore, the activation timing of the sense amplifier 14 can be changed for each row (that is to say, each word line WL) of the memory cell array 10. Since a sensing operation is performed at an optimum timing for each row of the memory cell array 10, it is possible to increase the operating speed of the semiconductor memory device 1 and reduce the energy consumption (power consumption) at the same time.

Generally, the activation timing of each sense amplifier must be matched with a memory cell having the lowest operating speed in a memory cell array. In this case, the power consumption increases because the time during which the amplitude of a signal appears on a bit line prolongs in a memory cell having a high operating speed. In the first embodiment, however, the activation timing of the sense amplifier 14 can be changed for each row of the memory cell array 10. This makes it possible to increase the operating speed and reduce the power consumption at the same time.

Also, the row decoder 13 deactivates a selected word line WL when receiving the timing signal WLCT that is activated at the same timing as the activation timing of the sense amplifier 14. Accordingly, the power consumption can further be reduced because the time during which signals are output to the pair of bit lines BL and /BL can be optimized.

Second Embodiment

Since a column address is used in a normal SRAM, the activation timing of a sense amplifier for each row may change when a column address changes. In the second embodiment, therefore, the activation timing of a sense amplifier is controlled in accordance with a column address.

Figure 6:
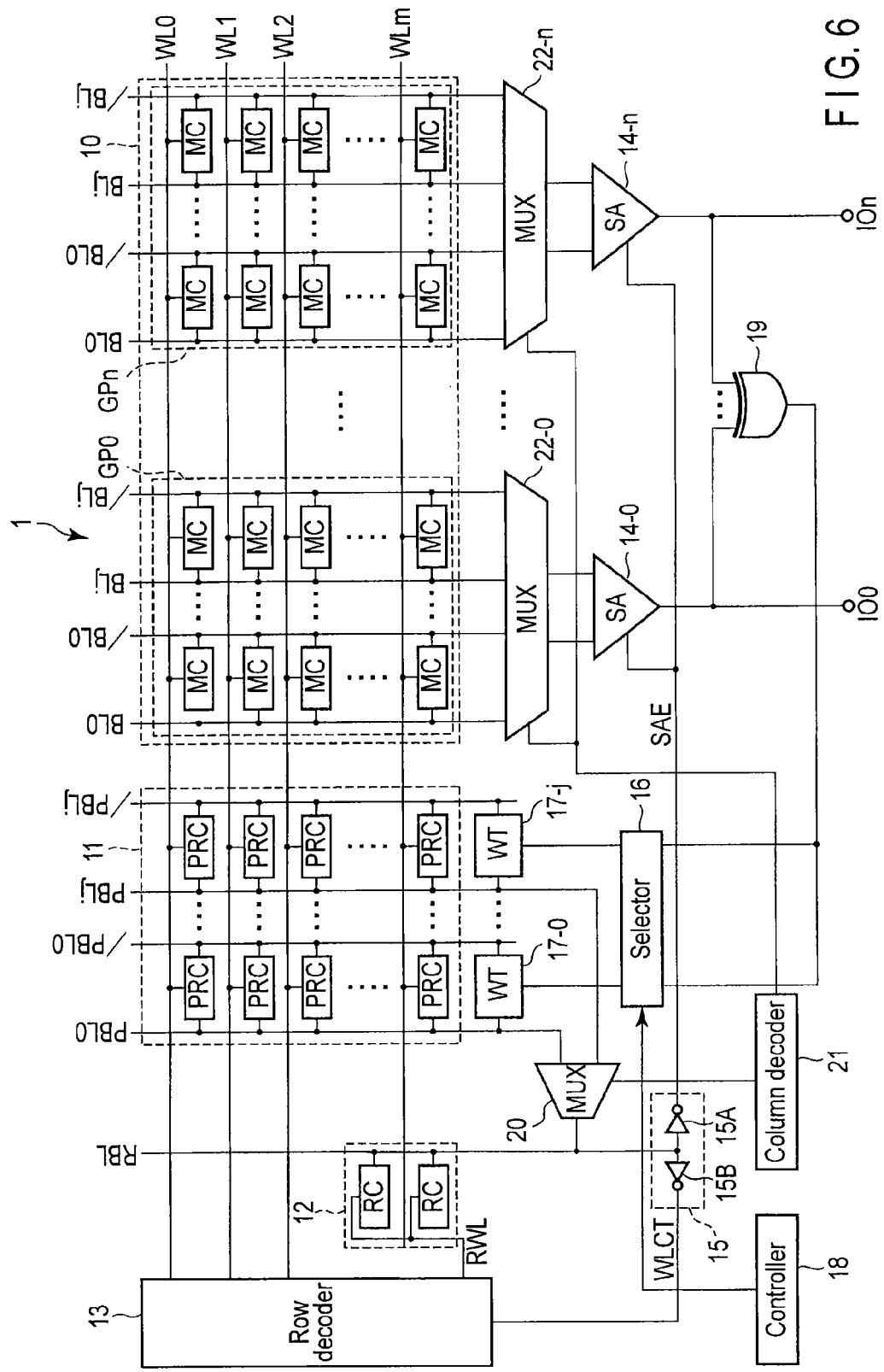
FIG. 6 is a block diagram showing the arrangement of a semiconductor memory device according to the second embodiment.

FIG. 6 is a block diagram showing the arrangement of a semiconductor memory device 1 according to the second embodiment. A memory cell array 10 includes (n+1) groups GP0 to GPn. Each group GP includes (j+1) pairs of bit lines BL0 and /BL0 to BLj and /BLj, where j is an integer greater than zero. The number of groups GP corresponds to the number of inputs/outputs (IOs). The number of pairs of bit lines BL and /BL, that is to say, the number of columns in each group GP, corresponds to the number of column addresses.

A programmable replica cell array 11 includes (j+1) pairs of bit lines PBL0 and /PBL0 to PBLj and /PBLj. That is, the number of columns in the programmable replica cell array 11 corresponds to the number of columns in the group GP.

The pairs of bit lines BL and /BL in each group GP are connected to a corresponding column selector (MUX) 22. Each of column selectors 22-0 to 22-$n$ selects one pair of bit lines BL and /BL based on a column address supplied from a column decoder 21. The pair of bit lines BL and /BL selected by the column selector 22 is connected to a corresponding sense amplifier 14. Data sensed and amplified by sense amplifiers 14-0 to 14-$n$ are respectively output to input/output terminals IO0 to IOn.

Bit lines PBL0 to PBLj arranged in the programmable replica cell array 11 are connected to a column selector (MUX) 20. The column selector 20 selects one bit line PBL based on a column address supplied from the column decoder 21. The bit line PBL selected by the column selector 20 is connected to a replica bit line RBL.

The operation of the semiconductor memory device 1 arranged as described above will be explained below.

When reading, the column selectors 22-0 to 22-n each select a corresponding pair of bit lines BL and /BL based on a column address supplied from the column decoder 21. Similarly, the column selector 20 selects a corresponding pair of bit lines PBL and /PBL based on the column address supplied from the column decoder 21. For example, when the column address designates column 0, the pairs of bit lines BL0 and /BL0 in the groups GP0 to GPn are respectively connected to sense amplifiers 14-0 to 14-n. Also, bit line PBL0 is connected to the replica bit line RBL.

Subsequently, the row decoder 13 activates a selected word line WL. Then, the programmable replica cell PRC connected to the selected word line WL superposes data on the replica bit line RBL. Consequently, an enable signal SAE goes high at an optimum timing, and sense amplifiers 14-0 to 14-n having received the enable signal SAE respectively sense and amplify data on the pairs of bit lines BL and /BL.

In addition, a timing signal WLCT goes high at the same timing as that of the enable signal SAE. The row decoder 13 having received the timing signal WLCT negates the selected word line WL.

Note that FIG. 6 shows a configuration example in which one programmable replica cell PRC is formed for each column address, so two kinds of information can be set for each column address. The number of programmable replica cells PRC for each column address can be set to an arbitrary number.

Figure 7:
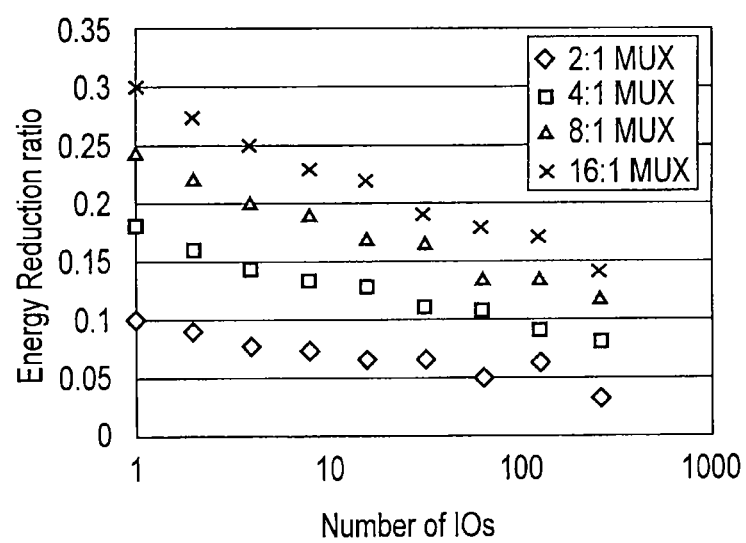
FIG. 7 is a graph showing the simulation results of energy consumption.

FIG. 7 is a graph showing the simulation results of energy consumption. In FIG. 7, the abscissa represents the number of inputs/outputs (IOs), and the ordinate represents the reduction ratio of energy consumed by a bit line. FIG. 7 shows four graphs, that is to say, a graph when the number of columns in the group GP is two (when a column address has one bit), a graph when the number of columns is four (when a column address has two bits), a graph when the number of columns is eight (when a column address has three bits), and a graph when the number of columns is sixteen (when a column address has four bits).

FIG. 7 shows the energy reducing effect when optimum activation timings of sense amplifiers are generated for columns designated by column addresses. Also, the energy reducing effect increases as the number of IOs decreases, and as the number of columns for each IO increases.

In the second embodiment as described in detail above, the pairs of bit lines BL and /BL corresponding to the number of column addresses are formed in each group GP. Also, the programmable replica cell PRC is prepared for each column address, and the programmable replica cell PRC to be selected is changed in accordance with a column address.

This makes it possible to optimize the activation timing of a sense amplifier with respect to columns selected by a given column address in the memory cell array 10. Other effects are the same as those of the first embodiment.

Third Embodiment

Information to be stored in a programmable replica cell is not limited to information for controlling the activation timing of a sense amplifier, and may also be information on a characteristic that changes from one row to another in a memory cell array. In the third embodiment, information on the power supply voltage of a memory cell is stored in a programmable replica cell, and the power supply voltage of a memory cell is switched based on this information.

FIG. 8 is a block diagram showing the arrangement of a semiconductor memory device 1 according to the third embodiment. A cell array unit 30 includes a memory cell array 10, first programmable replica cell array 11, second programmable replica cell array 31, and replica cell array 12.

The programmable replica cell array 11 includes programmable replica cells PRC1. The arrangement and function of the programmable replica cell array 11 are the same as those of the first embodiment. Note that for the sake of simplicity, FIG. 8 shows programmable replica cells PRC1 in a column connected to a pair of bit lines PBL0 and /PBL0.

The programmable replica cell array 31 includes programmable replica cells PRC2. The programmable replica cell array 31 also includes word lines WL0 to WLm, and a pair of bit lines PBL1 and /PBL1. Programmable replica cells PRC2 are arranged at the intersections of the word lines WL and the pair of bit lines PBL1 and /PBL1. The circuit configuration of programmable replica cell PRC2 is the same as that of a memory cell MC. Programmable replica cell PRC2 stores information on the power supply voltage of the memory cell MC.

Bit line PBL1 is connected to a signal generator 32. The signal generator 32 is, for example, an inverter. The signal generator 32 generates a switching signal SW based on the voltage of bit line PBL1. The switching signal SW is supplied to a power switching circuit 33.

The power switching circuit 33 is connected to a power terminal at a power supply voltage VDDL and a power terminal at a power supply voltage VDDH, and receives the power supply voltages VDDL and VDDH, where VDDL<VDDH. The power switching circuit 33 applies the power supply voltage VDDL or VDDH to the cell array unit 30 based on the switching signal SW.

Next, the operation of the semiconductor memory device 1 arranged as described above will be explained. The power switching circuit 33 normally applies the power supply voltage VDDL to the cell array unit 30, so the cell array unit 30 operates by using the power supply voltage VDDL.

Assume that a row connected to word line WL0 in the memory cell array 10 has a low operating speed. Binary 1 is written to programmable replica cell PRC2 connected to word line WL0. When word line WL0 is selected in a read, the switching signal SW goes low. When the switching signal SW is low, the power switching circuit 33 applies the power supply voltage VDDH to the cell array unit 30, so the cell array unit 30 operates by using the power supply voltage VDDH. This makes it possible to increase the operating speed of the memory cell MC, that is to say, shorten the time before a signal having a desired amplitude appears on a bit line.

Note that when the power supply voltage is raised, the energy consumption increases only when reading data from the corresponding word line WL. However, if the ratio of rows using the power supply voltage VDDH is low, the increase in average energy consumption of the whole memory is very small.

Conversely, binary 0 is written to programmable replica cell PRC2 of a row having a high or average operating speed. When the word line WL of this row is selected, the switching signal SW goes high. When the switching signal SW is high, the power switching circuit 33 applies the power supply voltage VDDL to the cell array unit 30, so the cell array unit 30 operates by using the power supply voltage VDDL.

The method of writing to the programmable replica cell array 31 is the same as that for the programmable replica cell array 11 explained in the first embodiment.

Note that programmable replica cell PRC2 is desirably designed to have an operating speed higher than that of the memory cell MC. For example, the operating speed of programmable replica cell PRC2 can be made higher than that of the memory cell MC by decreasing the threshold voltage or increasing a gate width W (channel width) of transistors forming programmable replica cell PRC2, compared to the memory cell MC. Since this can increase the read speed of the programmable replica cell PRC, the power switching timing can be advanced.

In the third embodiment as described in detail above, the semiconductor memory device 1 includes programmable replica cell PRC2 for storing information on a characteristic that changes from one row to another in the memory cell array 10, that is to say, information on the power supply voltage of a memory cell. When reading, the power supply voltage of the memory cell MC is switched based on the information in programmable replica cell PRC2. This makes it possible to increase the operating speed of the memory cell MC.

Note that the second embodiment is applicable to the third embodiment as well. That is, the programmable replica cell array 31 may also include columns equal in number to column addresses.

Fourth Embodiment

In the fourth embodiment, information on the voltage of a word line is stored in a programmable replica cell, and the voltage of a word line is switched based on this information.

FIG. 9 is a block diagram showing the arrangement of a semiconductor memory device 1 according to the fourth embodiment. A programmable replica cell PRC2 stores information on the voltage of a word line.

A switching signal SW is supplied to a power switching circuit 33. The power switching circuit 33 is connected to a power terminal at a power supply voltage VDDL and a power terminal at a power supply voltage VDDH, and receives the power supply voltages VDDL and VDDH, where VDDL<VDDH. Based on the switching signal SW, the power switching circuit 33 applies the power supply voltage VDDL or VDDH to a row decoder 13.

The operation of the semiconductor memory device 1 arranged as described above will be explained below. The power switching circuit 33 normally applies the power supply voltage VDDL to the row decoder 13. When selecting a word line, therefore, the row decoder 13 sets the voltage of the selected word line at the power supply voltage VDDL.

Assume that a row connected to a word line WL0 in a memory cell array 10 has a low operating speed. Binary 1 is written to programmable replica cell PRC2 connected to word line WL0. When word line WL0 is selected in a read, the switching signal SW goes low. When the switching signal SW is low, the power switching circuit 33 applies the power supply voltage VDDH to the row decoder 13, so the row decoder 13 switches the voltage of word line WL0 to the power supply voltage VDDH. When the voltage of the word line WL is raised, the driving force of NMOS transistors (transfer transistors) Q5 and Q6 of a memory cell MC rises, and as a consequence the cell current increases. This increases the operating speed of the memory cell MC.

Conversely, binary 0 is written to programmable replica cell PRC2 in a row having a high or average operating speed. When the word line WL of this row is selected, the switching signal SW goes high. When the switching signal SW is high, the power switching circuit 33 applies the power supply voltage VDDL to the row decoder 13, so the row decoder 13 does not switch the voltage of the word line WL but keeps setting the voltage of the word line WL to the power supply voltage VDDL.

Note that programmable replica cell PRC2 is desirably designed to have an operating speed higher than that of the memory cell MC as in the third embodiment.

In the fourth embodiment as described in detail above, when reading, the voltage of a word line can be switched based on the information in programmable replica cell PRC2. This makes it possible to increase the operating speed of the memory cell MC. Note that the second embodiment is applicable to the fourth embodiment as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell array including memory cells;
   word lines connected to the memory cell array to select rows of the memory cell array;
   first bit lines connected to the memory cell array to select columns of the memory cell array;
   a replica cell array including replica cells respectively connected to the word lines, and storing information on characteristics of the rows of the memory cell array; and
   a second bit line connected to the replica cells,
   wherein an operation is changed for each row of the memory cell array based on the information in the replica cells.

2. The device of claim 1, wherein the information to be stored in the replica cells is information for controlling a cell current.

3. The device of claim 1, wherein
   the replica cell array includes columns equal in number to column addresses, and
   replica cells in a column corresponding to a column address are used in a read.

4. The device of claim 3, wherein
   the memory cell array includes groups,
   each of the groups includes columns equal in number to the column addresses, and
   data is read from a memory cell in a column corresponding to a column address in a read.

5. The device of claim 1, further comprising:
   a logic gate configured to perform a logic operation on data read from the memory cell array to the first bit lines; and
   a write circuit configured to write data to the replica cells based on an output from the logic gate.

6. The device of claim 1, further comprising a power supply circuit configured to supply power to the memory cell array, and to change the level of the power in accordance with a voltage of the second bit line.

7. The device of claim 1, further comprising:
   a row decoder connected to the word lines; and
   a power supply circuit configured to supply power to the row decoder,
   wherein the power supply circuit changes the level of the power in accordance with a voltage of the second bit line.

8. The device of claim 1, wherein the replica cell has the same arrangement as that of the memory cell.

9. The device of claim 1, wherein the memory cell comprises an SRAM cell.

10. A semiconductor memory device comprising:
a memory cell array including memory cells;
word lines connected to the memory cell array to select rows of the memory cell array;
first bit lines connected to the memory cell array to select columns of the memory cell array;
a replica cell array including first replica cells respectively connected to the word lines, and storing information on operating speeds of the rows of the memory cell array;
a second bit line connected to the first replica cells;
a second replica cell having fixed data;
a replica bit line connected to the second replica cell and the second bit line; and
sense amplifiers respectively connected to the first bit lines, and configured to be activated based on a voltage of the replica bit line.

11. The device of claim 10, wherein
the replica cell array includes columns equal in number to column addresses, and
first replica cells in a column corresponding to a column address is used in a read.

12. The device of claim 11, wherein
the memory cell array includes groups,
each of the groups includes columns equal in number to the column addresses, and
data is read from a memory cell in a column corresponding to a column address in a read.

13. The device of claim 10, further comprising:
a logic gate configured to perform a logic operation on data read from the memory cell array to the first bit lines; and
a write circuit configured to write data to the first replica cells based on an output from the logic gate.

14. The device of claim 10, further comprising a row decoder connected to the word lines,
wherein the row decoder negates a word line based on a voltage of the replica bit line.

15. The device of claim 10, further comprising a replica word line connected to the second replica cell,
wherein the replica word line is asserted simultaneously with a selected word line in a read.

16. The device of claim 10, wherein the first replica cell has the same arrangement as that of the memory cell.

17. The device of claim 10, wherein the memory cell comprises an SRAM cell.

* * * * *